US007789992B2

(12) United States Patent
Lee

(10) Patent No.: US 7,789,992 B2
(45) Date of Patent: Sep. 7, 2010

(54) NEUTRAL BEAM ETCHING DEVICE FOR SEPARATING AND ACCELERATING PLASMA

(75) Inventor: Won-tae Lee, Hwaseong-gun (KR)

(73) Assignee: Samsung Electronics Co., Ltd., Suwon-si (KR)

(*) Notice: Subject to any disclaimer, the term of this patent is extended or adjusted under 35 U.S.C. 154(b) by 603 days.

(21) Appl. No.: 11/414,417

(22) Filed: May 1, 2006

(65) Prior Publication Data

US 2007/0012403 A1 Jan. 18, 2007

(30) Foreign Application Priority Data

Jul. 13, 2005 (KR) .................. 10-2005-0063433

(51) Int. Cl.
*C23C 16/00* (2006.01)
*C23F 1/00* (2006.01)
*H01L 21/306* (2006.01)
*H05B 31/26* (2006.01)

(52) U.S. Cl. .............................. 156/345.41; 156/345.36; 156/345.37; 156/345.38; 156/345.39; 156/345.4; 156/345.42; 156/345.43; 156/345.44; 156/345.45; 156/345.46; 156/345.47; 156/345.48; 156/345.49; 118/723 I; 315/111.21; 315/111.51

(58) Field of Classification Search ............... 118/723 I; 156/345.48, 345.36–345.49; 315/111.21, 315/111.51

See application file for complete search history.

(56) References Cited

U.S. PATENT DOCUMENTS 4,362,632 A * 12/1982 Jacob .................... 422/186.04

5,811,022 A * 9/1998 Savas et al. .................... 216/68
6,293,406 B1 * 9/2001 Miller et al. ................... 209/39
2004/0163766 A1 * 8/2004 Kanarov et al. ........ 156/345.49
2004/0173758 A1 * 9/2004 Suzuki et al. ........... 250/423 R

FOREIGN PATENT DOCUMENTS

| JP | 48-081094 | | 10/1973 |
|---|---|---|---|
| JP | 59-151428 | A | 8/1984 |
| JP | 04-351838 | A | 12/1992 |
| JP | 08-181125 | A | 7/1996 |
| JP | 09-139364 | A | 5/1997 |
| JP | 2002-289585 | A | 10/2002 |
| JP | 2004-327405 | A | 11/2004 |
| JP | 2005-116865 | A | 4/2005 |
| KR | 2003-0030100 | A | 4/2003 |
| KR | 10-2003-0042959 | A | 6/2003 |
| KR | 2003-0064125 | A | 7/2003 |

* cited by examiner

*Primary Examiner*—Parviz Hassanzadeh
*Assistant Examiner*—Rakesh Dhingra
(74) *Attorney, Agent, or Firm*—Sughrue Mion, PLLC

(57) ABSTRACT

A neutral beam etching device for separating and accelerating a plasma is provided. The device includes a first chamber having a first opening formed at one side thereof; a second chamber having a second opening formed at one side thereof and being disposed inside the first chamber to form a plasma generation area; a first channel fluidly communicating the first opening with the plasma generation area; a second channel fluidly communicating the second opening with the plasma generation area; a coil disposed on an outer surface of the first chamber and which generates a magnetic field to generate a plasma in the plasma generation area; and an acceleration part disposed within the first and second chambers and configured to separate the plasma into a positive ion and an electron, accelerate the positive ion and the electron, and discharge the positive ion and electron through the first and the second channels.

9 Claims, 4 Drawing Sheets

NEUTRAL BEAM ETCHING DEVICE FOR SEPARATING AND ACCELERATING PLASMA

CROSS-REFERENCE TO RELATED APPLICATIONS

This application claims priority from Korean Patent Application No. 2005-63433, filed on Jul. 13, 2005, in the Korean Intellectual Property Office, the entire contents of which is incorporated herein by reference.

BACKGROUND OF THE INVENTION

1. Field of the Invention

The present invention relates to a neutral beam etching device, and more particularly, to a neutral beam etching device which separates and accelerates a plasma using a grid.

2. Description of the Related Art

A neutral beam etching device uses a plasma state material to etch a wafer. In order to obtain energy sufficient to etch the wafer, the neutral beam etching device has to accelerate a plasma generated in a predetermined area thereof.

A method for accelerating a plasma has been developed for the purpose of studying an ion engine of a rocket for space travel and nuclear fusion, and has been recently used to etch a wafer in the process of manufacturing a semiconductor.

The plasma is a gas that is separated into an electron having negative charges and an ion having positive charges at high temperature. The plasma has high efficiency of charge separation and also is electrically neutral because the positive charge equals to the negative charges. Generally, the three states of matter include solids, liquids, and gases. The plasma is known as the fourth state of matter. Most types of matter are converted from the solid state to the liquid state and from the liquid state to the gaseous state as temperature increases. The gases are separated into electrons and atomic nuclei at tens of thousands of degrees Celsius (° C.) and thus enter a plasma state. Since the plasma state is neutral, an etching device using the plasma is called a neutral beam etching device.

FIG. 1 is a view illustrating a conventional neutral beam etching device. Referring to FIG. 1, the neutral beam etching device adopts a phase matching method and so it is called a 'traveling wave engine'. Referring to FIG. 1, the neutral beam etching device comprises an external coil 10, an inner coil 20, a discharge coil 30, an external cylinder 40, an inner cylinder 50, a cover 60 and a channel 70.

The cover 60 bridges between the external cylinder 40 and the inner cylinder 50 such that the channel 70 is formed in a space between the external cylinder 40 and the inner cylinder 50. The discharge coil 30 is formed on a top of the cover 60.

The external coil 10 and the inner coil 20 comprise a plurality of coils. The coils coaxially wind around the channel 70 in parallel to one another. In FIG. 1, each of the external coil 10 and the inner coil 20 comprises three coils 1, 2, 3.

When electric currents are applied to the external coil 10, the inner coil 20 and the discharge coil 30, a magnetic filed is generated inside the channel 70. The generated magnetic field generates an induced current according to Maxwell's equations and the generated induced current converts the gases existing in the channel 70 into the plasma state. Accordingly, a plasma is generated in an upper portion of the channel 70.

The plasma generated in the upper portion of the channel 70 is accelerated in the direction of outlet (marked by the arrow) by applying currents to the external and inner coils 10 and 20 winding from the upper portion of the channel 70 to the outlets in sequence. That is, the currents are applied in the order of a first coil 1, a second coil 2 and a third coil 3. By applying the currents in order to the first, second, and third coils 1, 2, 3, a slope of magnetic field is generated at the channel 70 such that the plasma is accelerated.

However, the conventional neutral beam etching device cannot sufficiently accelerate the plasma generated in the upper portion of the channel 70 and thus does not have an energy sufficient to etch a wafer. Accordingly, a satisfactory etching performance cannot be achieved.

Also, phases of currents to be applied to the external and inner coils 10 and 20 have to be adjusted and matched so that the slopes of magnetic fields are generated in the channel 70 in sequence. However, if the plasma generated in the upper portion of the channel 70 has a low initial velocity, a difference between phases becomes larger and thus it is difficult to adopt the phase matching. If a small frequency of driving current is set for the initial velocity, the discharge coil 30 does not smoothly transmit energy to the plasma and thus plasma generation efficiency deteriorates. As a result, an etching efficiency deteriorates.

SUMMARY OF THE INVENTION

The present invention has been developed in order to address these and other problems in the related art. Accordingly, an aspect of the present invention is to provide a neutral beam etching device which arranges grids within a channel and separates and accelerates a plasma by using an electrostatic force, thereby obtaining an energy sufficient to etch a wafer and thus improve etching efficiency.

Another aspect of the present invention is to provide a neutral beam etching device which use a pyramid-shaped chamber to focus a plasma separated and accelerated by an electrostatic force on an area to be etched.

The above and other aspects are achieved by providing a neutral beam etching device comprising a first chamber having a first opening formed at one side thereof, a second chamber having a second opening formed at one side thereof and being disposed inside the first chamber to form a plasma generation area, a first channel fluidly communicating the first opening with the plasma generation area, a second channel fluidly communicating the second opening with the plasma generation area, a coil which is disposed on an outer surface of the first chamber and which generates a magnetic field to generate a plasma in the plasma generation area, and an acceleration part which is disposed within the first chamber and the second chamber and which is configured to separate the plasma into a positive ion and an electron, accelerate the positive ion and the electron, and discharge the positive ion and electron through the first and the second channels.

Preferably, but not necessarily, the acceleration part comprises a first grid which is disposed in the first channel and which accelerates and discharges one of the positive ion and the electron of the plasma through the first channel, and a second grid which is disposed in the second channel and which accelerates and discharges the remaining one of the positive ion and the electron through the second channel.

Preferably, but not necessarily, the neutral beam etching device further comprises a bridge part which is configured to bridge between the first and the second chambers.

Preferably, but not necessarily, the bridge part is arranged at intervals between the first chamber and the second chamber.

Preferably, but not necessarily, the first chamber is in the shape of a pyramid such that the first chamber has a closed surface which has a larger size than that of the first opening and is formed at an opposite side to the first opening, and a lateral surface drawn from the first opening to the closed surface.

Preferably, but not necessarily, the second chamber is in the shape of a pyramid such that the second chamber has a top surface which is formed at an opposite side to the second opening and has a larger size than that of the second opening, and a lateral surface drawn from the second opening to the top surface.

Preferably, but not necessarily, the first channel is formed between the lateral surface of the first chamber and the lateral surface of the second chamber.

Preferably, but not necessarily, the first grid is charged with a first polarity to thereby accelerate one of the positive ion and the electron existing in the plasma generation area that has an opposite polarity to the first polarity.

Preferably, but not necessarily, the second grid is charged with an opposite polarity to the first polarity to thereby accelerate one of the positive ion and the electrons exiting in the plasma generation area that has the first polarity.

Preferably, but not necessarily, the coil is formed on a top of the closed surface of the first chamber.

Preferably, but not necessarily, the neutral beam etching device further comprises a gas injection part which is disposed on the outer surface of the first chamber and which injects a gas into the plasma generation area.

BRIEF DESCRIPTION OF THE DRAWINGS

These and other aspects of the present invention will become apparent and more readily appreciated from the following description of exemplary embodiments, taken in conjunction with the accompanying drawings of which.

DETAILED DESCRIPTION OF EXEMPLARY EMBODIMENTS

Hereinafter, exemplary embodiments of the present invention will now be described in greater detail with reference to the accompanying drawings.

Figure 1:
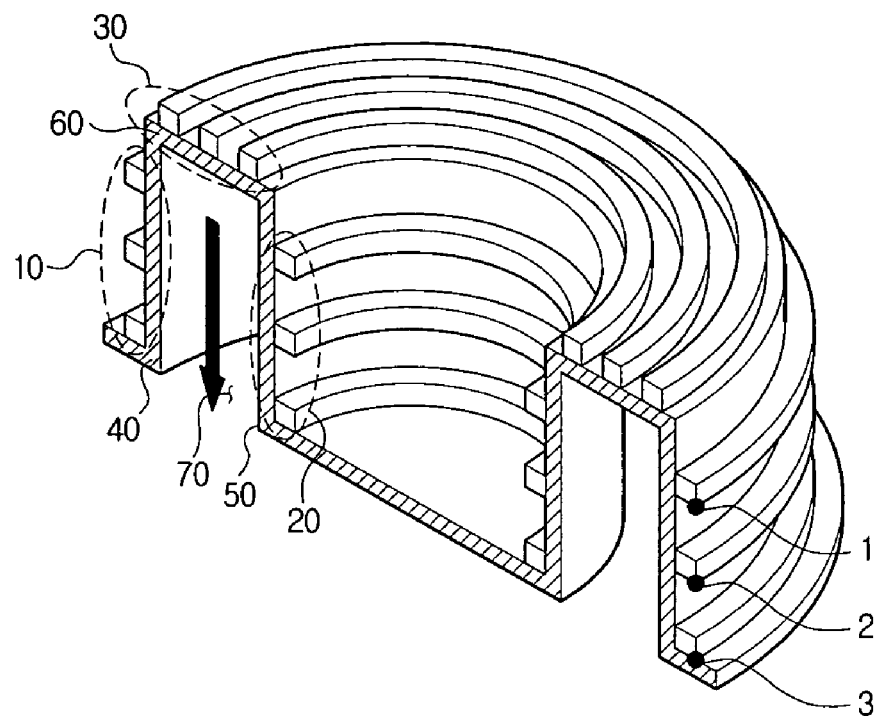
FIG. 1 is a view illustrating a conventional neutral beam etching device.
Figure 2:
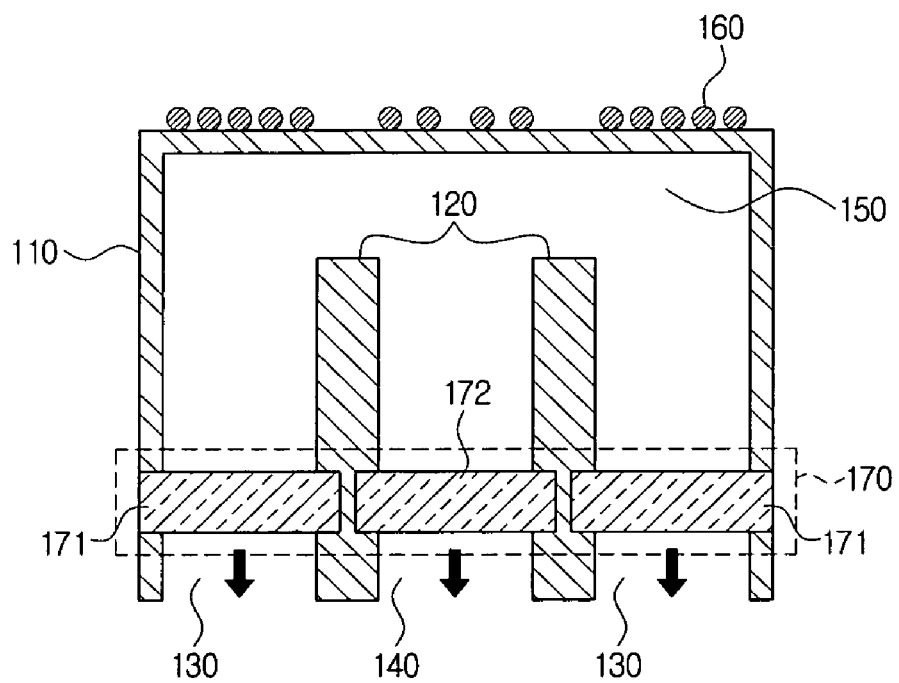
FIG. 2 is a view illustrating a neutral beam etching device according to a first exemplary embodiment of the present invention.

FIG. 2 is a view illustrating a neutral beam etching device according to a first exemplary embodiment of the present invention. Referring to FIG. 2, the neutral beam etching device comprises a first chamber 110, a second chamber 120, a first channel 130, a second channel 140, a coil 160 and an acceleration part 170.

The first chamber 110 has an opening formed at one side thereof and a closed surface formed at the other side.

The second chamber 120 is disposed inside the first chamber 110. The second chamber 120 has an opening formed at one side like the first chamber 110. The first and the second chambers 110 and 120 share the same axis but have different diameters. Accordingly, the opening of the second chamber 120 is nested in the opening of the first chamber 110.

The closed surface of the first chamber 110 is spaced away from the top of the second chamber 120 to form a plasma generation area 150. Gas is injected into the plasma generation area 150. In the conventional neutral beam etching device, a gas generation area is limited to the top of channel, which is insufficient to generate a plasma. However, the neutral beam etching device according to an exemplary embodiment of the present invention has the relatively large plasma generation area 150 because the first chamber 110 and the second chamber 120 are spaced away from each other.

The coil 160 is formed on the top of the closed surface of the first chamber 110. When current is applied to the coil 160, a magnetic field is generated in the plasma generation area 150. The generated magnetic field generates an induced current according to Maxwell's equations. The generated induced current converts the gas in the plasma generation area 150 into a plasma state.

The first channel 130 is formed between the inside surface of the first chamber 110 and the outer surface of the second chamber 120.

The second channel 140 is formed in the second chamber 120. The second chamber 140 fluidly communicates the opening of the second chamber 120 to the plasma generation area 150.

The acceleration part 170 separates the plasma generated in the plasma generation area 150 into positive ions and electrons, accelerates the positive ions and the electrons, and discharges them to the outside of the neutral beam etching device through the first and the second channels 130 and 140. If the positive ions are accelerated through the first channel 130, the electrons are accelerated through the second channel 140. If the electrons are accelerated through the first channel 130, the positive ions are accelerated through the second channel 140.

More specifically, the acceleration part 170 comprises a first grid 171 arranged in the first channel 130 and a second grid 172 arranged in the second channel 140. The first and the second grids 171 and 172 are lattice pattern nets formed of conductive material. The first and the second grids 171 and 172 are connected to power supplies having different polarities. Accordingly, the first and the second grids 171 and 172 are charged with different polarities.

If the first grid 171 is charged with positive polarity and the second grid 172 is charged with negative polarity, an electrostatic force is generated between the negative electrons of the plasma and the first grid 171, and thus the electrostatic force accelerates the negative electrons in the direction of an outlet of the first channel 130. Also, an electrostatic force is generated between the positive ions and the second grid 172, and thus the electrostatic force accelerates the positive ions in the direction of an outlet of the second channel 140. The arrows shown in FIG. 2 indicate the directions of outlet.

If the first grid 171 is charged with negative polarity and the second grid 172 is charged with positive polarity, the positive ions are accelerated through the first channel 130 and the electrons are accelerated through the second channel 140.

Figure 3:
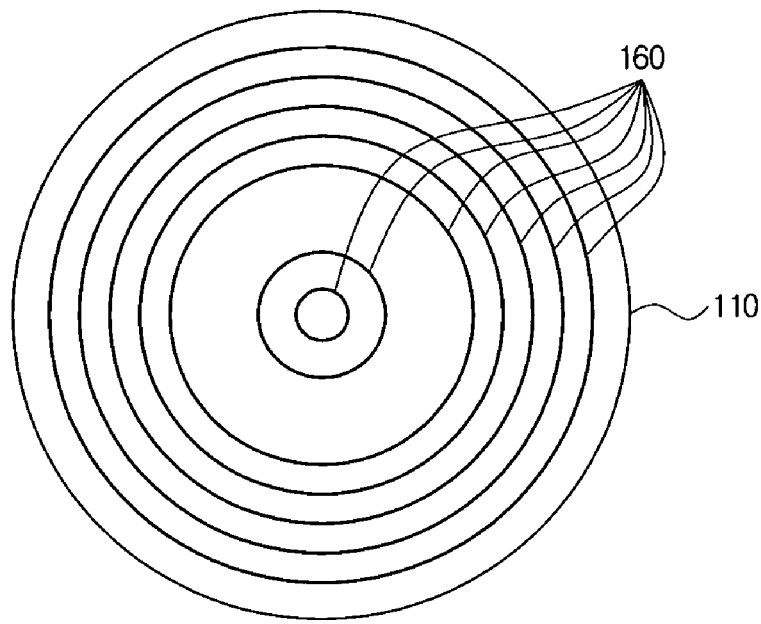
FIG. 3 is a top view of the neutral beam etching device of FIG. 2.

FIG. 3 is a top view illustrating the neutral beam etching device of FIG. 2. Referring to FIG. 3, the closed surface formed on the upper portion the first chamber 110 is formed in the shape of a circle.

The coil 160 comprises a plurality of coils that are formed on the closed surface of the first chamber 110 coaxially with the first chamber 110. The coil 160 may be formed in a spiral pattern.

Figure 4:
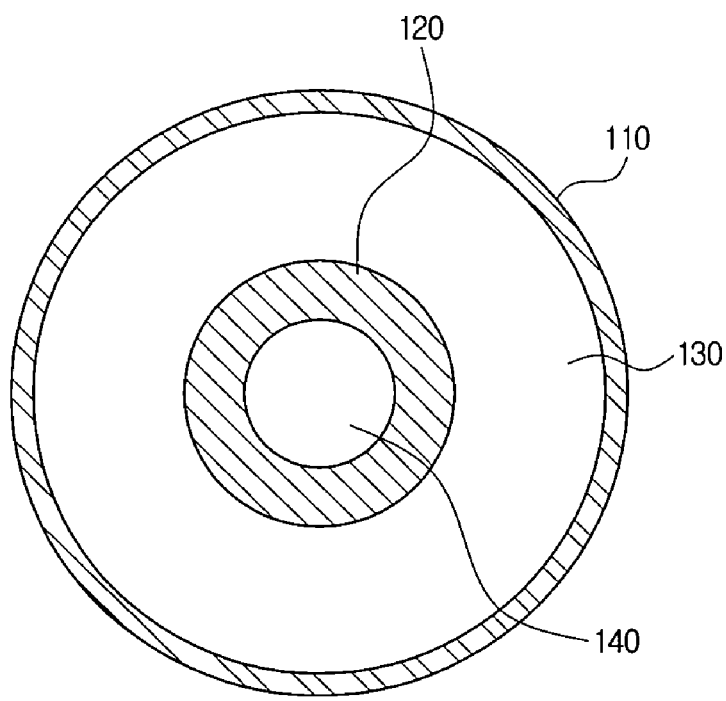
FIG. 4 is a bottom view of the neutral beam etching device of FIG. 2.

FIG. 4 is a bottom view of the neutral beam etching device of FIG. 2. Referring to FIG. 4, the outlet of the first channel 130 is formed in a ring shape having an empty space at center, and the outlet of the second channel 140 is in the form of a circle. Accordingly, the first and the second grids 171 and 172 are in the shapes of a ring and a circle, respectively.

Figure 5:
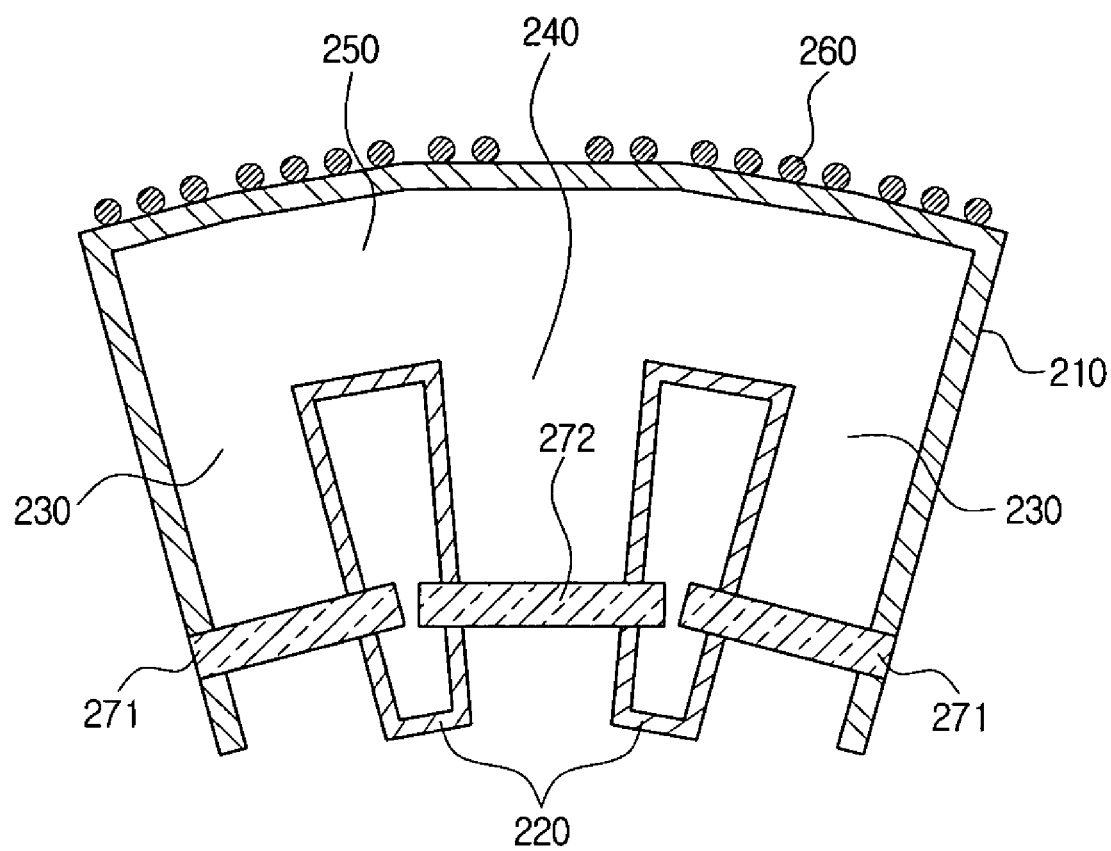
FIG. 5 is a view illustrating a neutral beam etching device according to a second exemplary embodiment of the present invention.

FIG. 5 is a view illustrating a neutral beam etching device according to a second exemplary embodiment of the present invention. Referring to FIG. 5, the neutral beam etching device has a first chamber 210 and a second chamber 220 which are in the shape of a pyramid. That is, openings of the first and the second chambers 210 and 220 are formed towards a common vertex of the pyramid. The first and the second chambers 210 and 220 may be in the shape of a cone, quadrangular pyramid, or pentagonal pyramid. Accordingly, positive ions and electrons generated in a plasma generation area 250 are discharged towards outlets and focused onto an area that is to be etched.

According to the pyramid shape of the first and the second chambers 210 and 220, a first grid 271 is of a different shape than in the first exemplary embodiment described above. The first grid 271 has an inside ring edge upwardly inclining. A second grid 272 is in the shape of a circle. Since a coil 260, a first channel 230, and a second channel 240 are similar to those of the first exemplary embodiment in terms of general shapes and functions, descriptions thereof are omitted.

Figure 6:
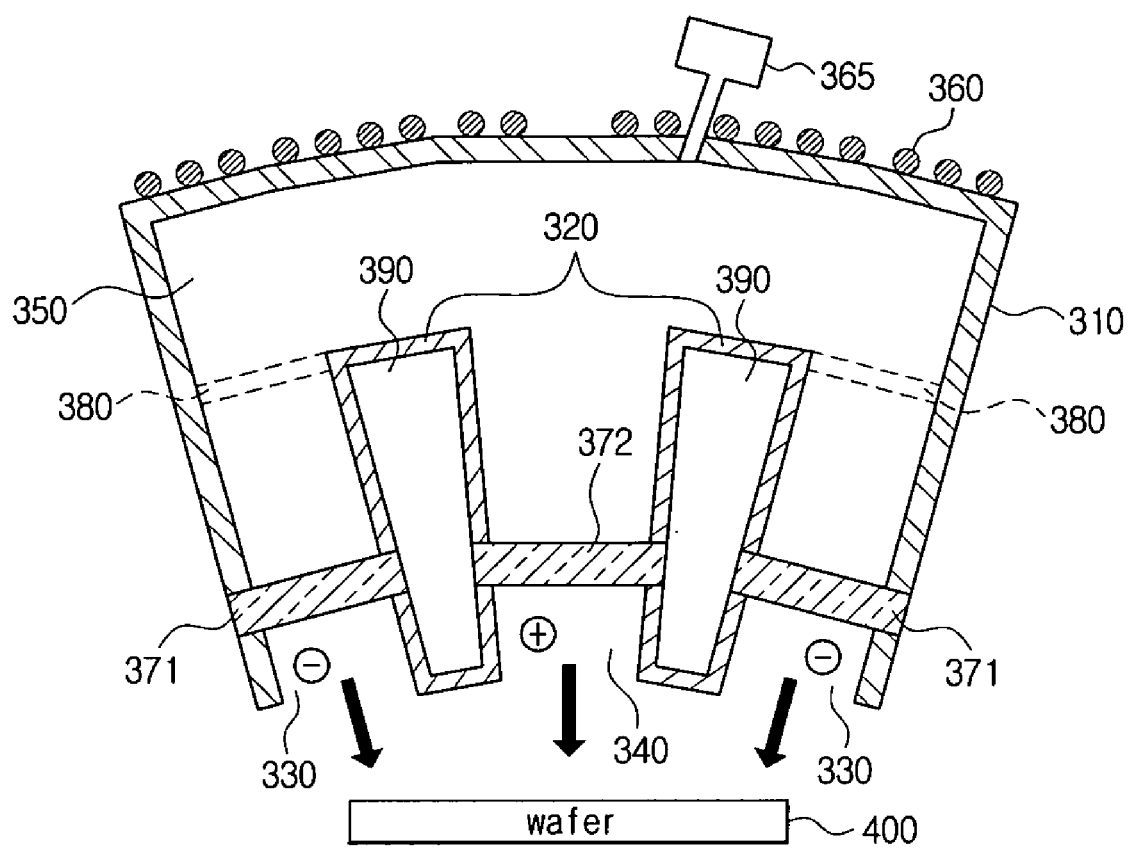
FIG. 6 is a view illustrating a neutral beam etching device according to a third exemplary embodiment of the present invention.

FIG. 6 is a view illustrating a neutral beam etching device according to a third exemplary embodiment of the present invention. Referring to FIG. 6, the neutral beam etching device comprises a first chamber 310, a second chamber 320, a first channel 330, a second channel 340, a coil 360, a first grid 371, and a second grid 372. The neutral beam etching device according to the third exemplary embodiment further comprises a gas injection part 365 and a bridge part 380.

Positive ions and electrons accelerated in a plasma generation area 350 through the first and the second channels 330 and 340 are discharged towards a wafer 400 and used to etch an area formed on the wafer 400. The area may be predetermined.

Since the first chamber 310, the second chamber 320, the first channel 330, the second channel 340, the coil 360, the first grid 371, and the second grid 372 are similar to those of the second exemplary embodiment in terms of general structure and function, descriptions thereof are omitted.

The gas injection part 365 injects gas into the plasma generation area 350. The neutral beam etching device uses gas of Group 0 such as Ar, ionizable gas such as $O_2$ or $O_2$ compound, gas such as $C_2F_2$, or other similar gas known in the art. The gas injection part 365 injects the gas through a connection pipe connected to the plasma generation area 350.

The bridge part 380 bridges between the first chamber 310 and the second chamber 320. Although the first chamber 310 and the second chamber 320 are connected to each other by the first grid 371, it is advantageous to form the bridge part 380 to bear the weight of the second chamber 320. The location of the bridge part 380 is limited to a specific area so that positive ions and electrons generated in the plasma area 350 are smoothly discharged towards the first and the second channels 330 and 340. If the first and the second chambers 310 and 320 are in the shape of a pyramid, the bridge part 380 is arranged at intervals of 90° to support the second chamber 320 without unduly obstructing positive ion and electron discharge.

The second chamber 320 has an empty portion 390 formed in the rest portion except the second channel 340. Therefore, the weight of the second chamber 320 is reduced and thus a load exerted to the bridge part 380 is reduced.

According to exemplary embodiments of the present invention as described above, the plasma is separated into positive ions and electrons and accelerated by the electrostatic force. Accordingly, acceleration energy necessary for an etching process can be saved and thus etching efficiency is improved. Also, if the first and the second chambers 110, 120, 210, 220, and 310, 320 of first, second, and third exemplary embodiments, respectively, are in the shape of a pyramid, the separated and accelerated positive ions and electrons are focused into the area that is to be etched. As a result, it is easier to perform the etching operation.

The foregoing embodiments and aspects are merely exemplary and are not to be construed as limiting the present invention. The present teaching can be readily applied to other types of apparatuses. Also, the description of exemplary embodiments of the present invention is intended to be illustrative, and not to limit the scope of the claims, and many alternatives, modifications, and variations will be apparent to those skilled in the art.

What is claimed is:

1. A neutral beam etching device comprising:
   a first chamber having a first opening formed at one side thereof;
   a second chamber having a second opening formed at one side thereof and being disposed inside the first chamber to form a plasma generation area;
   a first channel formed between an inside surface of the first chamber and an outer surface of the second chamber and fluidly communicating the first opening with the plasma generation area;
   a second channel formed in the second chamber and fluidly communicating the second opening with the plasma generation area and partitioned from the first channel by a wall of the second chamber;
   a coil which is disposed on an outer surface of the first chamber and which generates a magnetic field to generate a plasma in the plasma generation area; and
   an acceleration part comprising a first grid charged with a first polarity and a second grid charged with a second polarity which is different from the first polarity, wherein the first grid is disposed in the first channel and accelerates and discharges one of positive ions and electrons of the plasma through the first channel, and the second grid is disposed in the second channel and accelerates and discharges the other one of the positive ions and the electrons through the second channel, wherein the first and the second grids are separated by the wall of the second chamber; and
   wherein the positive ions and the electrons are discharged towards a wafer to etch a predetermined area on the wafer.

2. The neutral beam etching device as claimed in claim 1, further comprising a bridge part which is configured to bridge between the first and the second chambers.

3. The neutral beam etching device as claimed in claim 2, wherein the bridge part is arranged at intervals between the first chamber and the second chamber.

4. The neutral beam etching device as claimed in claim 1, wherein the first chamber is in the shape of a pyramid such that the first chamber has a closed surface which has a larger size than that of the first opening and is formed at an opposite side to the first opening, and a lateral surface drawn from the first opening to the closed surface.

5. The neutral beam etching device as claimed in claim 4, wherein the second chamber is in the shape of a pyramid such that the second chamber has a top surface which is formed at an opposite side to the second opening and has a larger size than that of the second opening, and a lateral surface drawn from the second opening to the top surface.

6. The neutral beam etching device as claimed in claim 4, wherein the coil is formed on a top of the closed surface of the first chamber.

7. The neutral beam etching device as claimed in claim 1, wherein the first grid is charged with the first polarity to thereby accelerate one of the positive ion and the electrons existing in the plasma generation area that has polarity opposite to the first polarity.

8. The neutral beam etching device as claimed in claim 7, wherein the second grid is charged with the second polarity which is opposite to the first polarity to thereby accelerate one of the positive ion and the electrons exiting in the plasma generation area that has the first polarity.

9. The neutral beam etching device as claimed in claim 1, further comprising a gas injection part which is disposed on the outer surface of the first chamber and which is configured to inject a gas into the plasma generation area.

* * * * *